(12) United States Patent
Duffy et al.

(10) Patent No.: US 6,857,290 B2
(45) Date of Patent: Feb. 22, 2005

(54) METHOD OF APPLYING BARRIER COATINGS TO GLASS PANELS

(75) Inventors: Brad A. Duffy, Santa Rosa, CA (US); Robert W. Adair, Santa Rosa, CA (US)

(73) Assignee: JDS Uniphase Corporation, San Jose, CA (US)

( * ) Notice: Subject to any disclaimer, the term of this patent is extended or adjusted under 35 U.S.C. 154(b) by 0 days.

(21) Appl. No.: 10/744,364

(22) Filed: Dec. 22, 2003

(65) Prior Publication Data

US 2004/0134233 A1 Jul. 15, 2004

Related U.S. Application Data

(62) Division of application No. 09/990,195, filed on Nov. 21, 2001, now Pat. No. 6,730,373.

(51) Int. Cl.$^7$ .............................................. C03C 17/34
(52) U.S. Cl. .............................. 65/23; 65/60.2; 65/60.3; 65/61; 65/114
(58) Field of Search ........................... 65/114, 23, 60.2, 65/60.3, 61

(56) References Cited

U.S. PATENT DOCUMENTS

| | | | | |
|---|---|---|---|---|
| 3,034,916 A | * | 5/1962 | Eshner ........................ 428/469 |
| 4,466,992 A | | 8/1984 | Dreiling ....................... 427/39 |
| 4,790,922 A | * | 12/1988 | Huffer ..................... 204/192.27 |
| 4,806,220 A | * | 2/1989 | Finley ..................... 204/192.27 |
| 4,989,789 A | * | 2/1991 | Moruno ....................... 239/433 |
| 5,010,037 A | | 4/1991 | Lin et al. .................... 437/200 |
| 5,059,295 A | * | 10/1991 | Finley ..................... 204/192.27 |
| 5,213,880 A | | 5/1993 | Yabuchi ...................... 428/217 |
| 5,272,133 A | | 12/1993 | Josefowicz et al. ............. 505/1 |
| 5,378,506 A | | 1/1995 | Imai et al. ................... 427/529 |
| 5,558,946 A | | 9/1996 | Nishimoto ................... 428/692 |
| 5,645,885 A | | 7/1997 | Nishimoto ............... 427/126.3 |
| 5,804,102 A | | 9/1998 | Oi et al. ..................... 252/587 |
| 5,821,001 A | * | 10/1998 | Arbab et al. ................. 428/623 |
| 5,920,080 A | | 7/1999 | Jones ......................... 257/40 |
| 5,942,338 A | * | 8/1999 | Arbab et al. ................. 428/623 |
| 6,024,084 A | * | 2/2000 | Gerhardinger .............. 126/200 |
| 6,069,443 A | | 5/2000 | Jones et al. .................. 313/504 |
| 6,146,225 A | | 11/2000 | Sheats et al. ................. 445/24 |
| 6,188,174 B1 | | 2/2001 | Marutsuka ................... 313/476 |
| 6,197,408 B1 | | 3/2001 | Kanbara et al. ............. 428/209 |
| 6,207,266 B1 | | 3/2001 | Kanbara et al. ............. 428/323 |
| 6,214,422 B1 | | 4/2001 | Yializis ...................... 427/488 |
| 6,229,085 B1 | | 5/2001 | Gotoh et al. ........... 174/35 MS |
| 6,251,800 B1 | | 6/2001 | Sun et al. .................... 438/763 |
| 6,258,637 B1 | | 7/2001 | Wilk et al. ................... 438/151 |
| 6,266,037 B1 | | 7/2001 | Flasck ......................... 345/92 |
| 6,270,832 B2 | | 8/2001 | Honda et al. .................. 427/9 |
| 6,410,173 B1 | * | 6/2002 | Arfsten et al. ............. 428/701 |
| 6,410,887 B1 | * | 6/2002 | Reunamaki ................. 219/388 |
| 6,469,685 B1 | | 10/2002 | Woodruff et al. ............. 345/60 |
| 6,472,073 B1 | * | 10/2002 | Singh et al. ................. 428/432 |
| 6,475,626 B1 | * | 11/2002 | Stachowiak ................. 428/428 |
| 6,495,251 B1 | * | 12/2002 | Arbab et al. ................. 428/336 |

\* cited by examiner

*Primary Examiner*—Sean Vincent
(74) *Attorney, Agent, or Firm*—Allen, Dyer, Doppelt, Milbrath & Gilchrist, P.A.

(57) ABSTRACT

An index-matching coating is applied directly to a low-emissivity ("lowE") thin-film coating. Nodules growing from a site in the lowE coating are removed to avoid propagation of defects through the layers of the index-matching coating. A tempering step in an oxygen-containing atmosphere produces compressive stress in the lowE coating and hardens the coating. The compressive stress facilitates removal of the nodules and the hardening allows mechanical cleaning of the lowE coating prior to the index-matching coating, further removing nodules. Magnesium-fluoride is used as the final layer of the index-matching coating in one embodiment to improve abrasion resistance. The resulting glass panel may be used as a display panel in a plasma display or an organic light-emitting diode display, for example.

24 Claims, 4 Drawing Sheets

METHOD OF APPLYING BARRIER COATINGS TO GLASS PANELS

CROSS-REFERENCE TO RELATED APPLICATIONS

This patent application is a divisional patent application of commonly owned, U.S. patent application Ser. No. 09/990,195 entitled GLASS PANEL WITH BARRIER COATING AND RELATED METHODS, by Brad A. Duffy and Robert W. Adair, filed Nov. 21, 2001, now U.S. Pat. No. 6,703,373, the disclosure of which is hereby incorporated in its entirety for all purposes.

STATEMENT REGARDING FEDERALLY SPONSORED RESEARCH OR DEVELOPMENT

Not applicable.

REFERENCE TO MICROFICHE APPENDIX

Not applicable.

BACKGROUND OF THE INVENTION

The present invention relates generally to improving the environmental durability of coated glass panels that are used in displays and similar applications, and more particularly to a coated glass panel that has been treated to remove particles before backfilling the voids left by the particles with an overcoat material.

Glass panels are used in a wide variety of display technology. Displays that can use glass panels include television sets, computer screens, and instrument panels, to name a few. The glass panels are often coated or otherwise treated to improve the performance characteristics or meet a specified requirement of the display. For example, a panel might be slightly etched to reduce reflectivity, or an anti-reflective film or coating might be applied to the front and/or back surface of the glass panel.

Films or coatings might be applied in a variety of ways. One approach applies a self-adhesive sheet of polyethylene terephthalate ("PET") to a glass panel. The PET sheet may be coated itself, such as with an anti-reflective ("AR") coating. The AR coating is typically a layer or layers of materials that improve the optical match between the PET and the air. Other techniques deposit a layer or layers of material directly onto the surface of the glass panel.

Some display products generate electro-magnetic interference ("EMI"), and glass panels used in such displays might be treated to reduce the EMI radiated from the panel into the environment, particularly toward a user. In some instances, a fine wire mesh is attached to or imbedded in a glass panel assembly to reduce emissions. The wire mesh is typically grounded through a wire. Such an assembly can be expensive and reduce the clarity or resolution of the display. Another approach has been to deposit a low-emissivity ("lowE") coating onto the surface of the glass panel. LowE coatings have been developed by, and are available from, a number of suppliers and often contain silver, copper, or gold incorporated into a layer or layers of the coating. LowE coatings typically have better than 45% transmission in the visible spectrum and a sheet resistivity of less than 5 Ohms per square, and in some instances have a sheet resistivity of about 0.5 Ohms per square.

Unfortunately, lowE coatings are often moisture sensitive, and moisture intrusion can induce corrosion in the coating layers. In particular, humidity can infiltrate the low-E coating and cause "blooms" to appear, which degrade the appearance of the panel. Moisture typically infiltrates through a defect in the coated layers. Several techniques address reducing the formation of defects, and other techniques have been developed to seal the defects. One approach is to attach a sheet of PET to the lowE coating with pressure-sensitive adhesive to seal the defects. The relatively thick PET layer protects the lowE coating from environmental moisture. The front surface of the PET sheet is coated to reduce reflections in some instances, typically in a roll coater before the PET sheet is applied to the glass.

However, using such a polymer sheet increases the number of components and assembly steps required for the glass panels. This in turn increases costs and decreases product yield and mechanical durability.

Therefore, a glass panel that can provide EMI shielding, high clarity, and that is resistant to moisture-induced corrosion is desirable.

BRIEF SUMMARY OF THE INVENTION

A thin-film barrier overcoat is deposited directly over a moisture-sensitive coating on a glass panel to provide environmental protection to the moisture-sensitive coating. In a particular embodiment, the moisture-sensitive coating contains a metallic layer, such as are common in lowE coatings. In a further embodiment, the barrier overcoat is an AR coating. Nodules, which otherwise might propagate defects through the thin-film barrier overcoat, have been removed from the lowE coating prior to the barrier overcoat deposition process. In one embodiment, the panel is tempered in an oxygen-containing atmosphere to facilitate the removal of nodules and to harden the lowE coating sufficiently for mechanical cleaning. Other coatings might not be tempered or need hardening to facilitate removal of the nodules. In a particular embodiment, the final thin-film layer of the barrier overcoat is a low-friction material, such as $MgF_2$. A second AR coating can be applied to the other surface of the glass to enhance the transmission of light through the panel from a display such as a plasma display, or that surface of the glass might support a device such as an organic light-emitting diode.

In another embodiment, a polymer sheet is attached to the surface of the glass substrate, which can be tempered or untempered, on the side opposite the lowE and AR coatings. A second AR coating can be applied to the polymer sheet before it is attached to the glass.

DETAILED DESCRIPTION OF THE INVENTION

A coated glass panel is treated to remove nodules that could become a source of moisture intrusion or other contamination. The panel is then treated with an overcoat layer to seal, and in some cases fill or partially fill, the voids left by the removed nodules. In one embodiment, the coating on the glass panel is a lowE coating that includes one or more layers of silver-containing material. The coated glass panel can be used in a display panel application, such as for a plasma display or an organic light-emitting diode display, and is typically rectangular and several centimeters to a few meters on an edge, although other configurations and sizes are possible. In other embodiments, the moisture-sensitive coating is opaque, such as a mirror coating.

Figure 1:
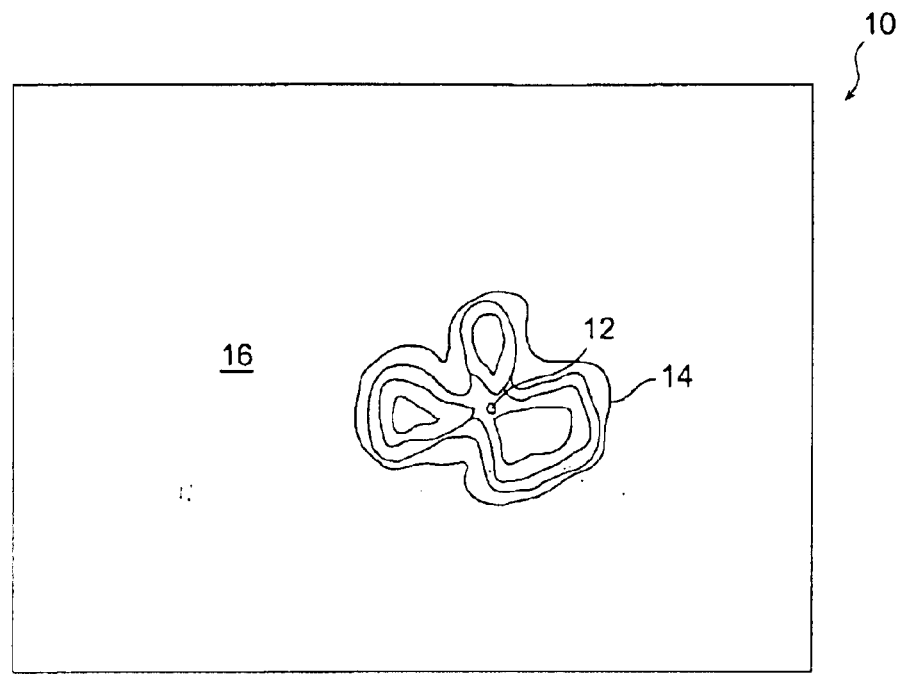
FIG. 1 is a simplified tracing of a micrograph illustrating a defect in a coated glass panel.

FIG. 1 is a simplified tracing of a micrograph illustrating a defect in a coated glass panel 10. Moisture has entered a pinhole 12 in the coating and has migrated through silver layer or layers in the coating, corroding those layers. The corrosion appears as a bright "bloom" 14 in the otherwise clear field 16 of the coated glass panel. Pinholes can be various sizes, i.e. diameters at the surface of the coating, but are generally in the range of 1–1000 microns. Larger pinholes degrade the optical quality of the coating even without moisture intrusion and corrosion. Pinholes that are sufficiently small resist moisture intrusion. In a particular application, most pinholes were between 5–40 microns, with the upper limit being consistent with the desired visual quality of the coated part.

Figure 2A:
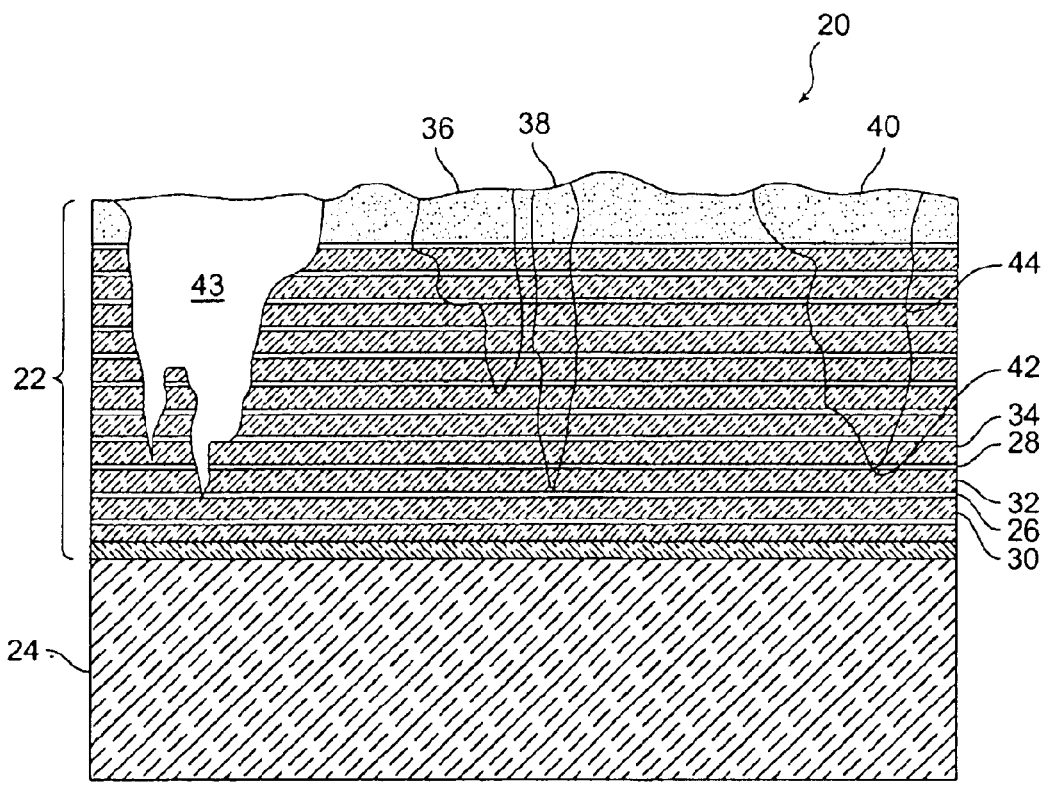
FIG. 2A is a simplified tracing of a scanning electron micrograph of a cross section of a portion of a coated glass panel.

FIG. 2A is a simplified tracing of a scanning electron micrograph of a cross section of a portion of a coated glass panel 20 illustrating nodules. A lowE coating 22 has been formed on a glass substrate 24. The glass substrate could be pane of "window glass", tempered glass, optical glass, laminated glass, or similar material, such as plastic panels and films suitable for the intended processing steps and quality of the finished part. LowE coatings are typically eight to fifteen layers thick with silver, silver alloy, or copper conductive layers 26, 28 surrounded by protective layers 30, 32, 34 of materials such as ZnO, $TiO_2$, $Si_3N_4$, $SiO_2$, $Nb_2O_5$ and others.

There are typically 3–5 conductive layers, with the sheet resistivity of each layer contributing to the overall sheet resistivity of the coating. Other designs may have more or less conductive layers. The conductive layers are sufficiently thin to transmit light, yet are sufficiently conductive to suppress electromagnetic emissions through the coating. The sheet resistances of the conductive layers vary from 50 ohms/sq down to less that 1.5 ohms/sq with visible transmission ranging from about 95% down to about 45% across the visible spectrum. Such coatings will be referred to as "transparent" for purposes of discussion, even though some transmission loss occurs and even though such coatings might not be equally transmissive throughout the visible spectrum. The protective layers are relatively moisture resistant and protect the metal layers from corrosion induced by moisture. The layers in the lowE coating are relatively thin and are typically deposited in a single vacuum step.

The conductive layers are typically grounded through a buss bar formed at the perimeter of the panel assembly. The buss bar can be of a silver frit, for example, and provides a reliable electrical contact to the conductive layers of the lowE coating. Other types of electrical contacts can be used to connect to the lowE coating.

Nodules 36, 38, 40 have formed in the lowE stack. A nodule 40 can grow from a defect site 42 on the substrate or within the thin film stack as a result of coating spatter or other external contaminants. Various changes in stress, such as a change in temperature of the thin film stack during processing or in use, can cause some nodules to loosen and fall out, resulting in pinholes 43. Even if nodules remain in the coating, moisture can travel down the boundary 44 of the nodule-coating interface and cause corrosion in the conductive layers.

Figure 2B:
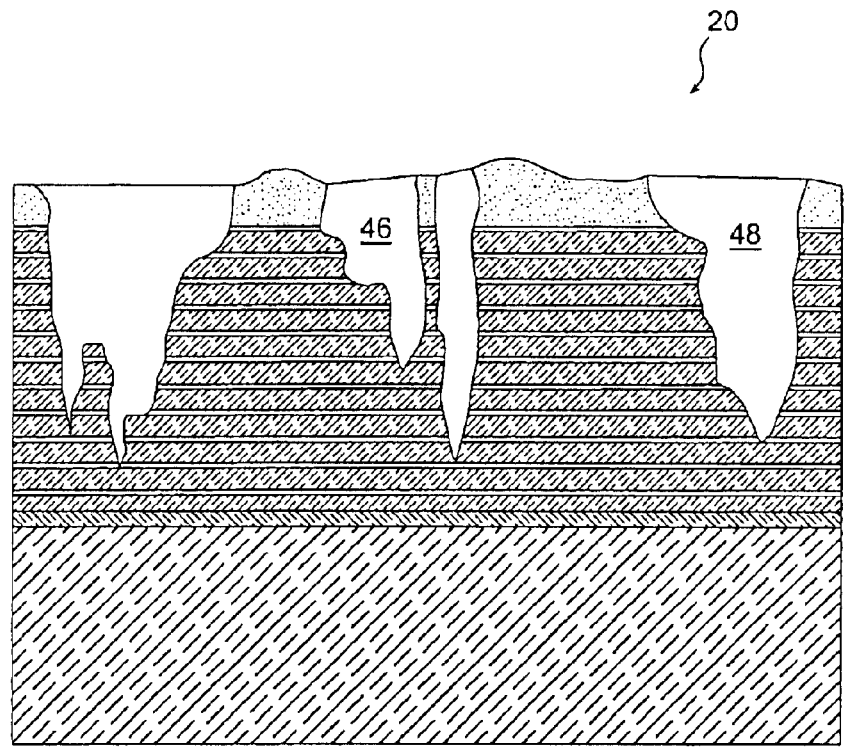
FIG. 2B is a simplified cross section of the coated glass panel of FIG. 2A with nodules removed to form pinholes according to an embodiment of the present invention.

FIG. 2B is a simplified cross section of the coated glass panel 20 illustrated in FIG. 2A with the nodules removed to form pinholes 46, 48 according to an embodiment of the present invention. While some may refer to defects in the coating as "pinholes" whether or not the nodule is present in the defect, for the purposes of this discussion the term "pinhole" refers to a defect from which a nodule has been removed, thus leaving a void. The process of removing the nodules will be discussed in further detail below.

Figure 2C:
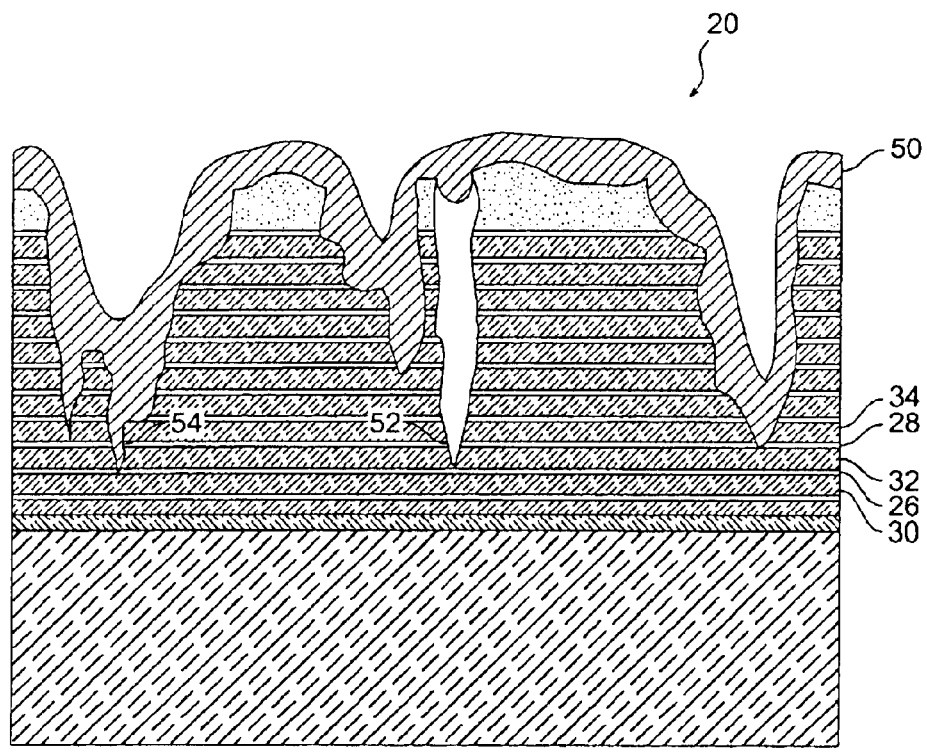
FIG. 2C is a simplified cross section of the coated glass panel with a barrier overcoat according to an embodiment of the present invention.

FIG. 2C is a simplified cross section of the coated glass panel 20 illustrated in FIG. 2B with a barrier overcoat according to an embodiment of the present invention. The pinholes have been sealed with a barrier overcoat 50. Some pinholes are essentially filled with overcoat material, while other pinholes might only be partially filled or basically sealed at the surface of the coating. The coating can be a lowE coating, or other coating that has layers that are sensitive to moisture-induced corrosion. The thickness of the barrier overcoat is not shown to scale, and the conformation of the barrier overcoat to the coating on the glass panel is merely exemplary. For example, a more viscous barrier overcoat may penetrate the pinholes less than a less viscous overcoat.

In a particular embodiment, a lowE coating includes several layers of various materials, including conductive layers 26, 28 and protective layers 30, 32, 34. The barrier overcoat may or may not seal the edges 52, 54 of the conductive layers exposed in the pinholes. The barrier overcoat may be additional vacuum-deposited thin film layers or may be a chemical layer, such as a perfluorosilane, that is sprayed, spun, evaporated, or otherwise applied to the surface of the coated glass panel. In one embodiment the barrier overcoat is an adhesive layer between the coated glass panel and a sheet of PET. In a further embodiment, the adhesive layer includes a dye to color-shift the output of the glass panel assembly.

In another embodiment the barrier overcoat is a series of vacuum-deposited thin films. In a particular embodiment, the series of vacuum-deposited thin films is selected to match the refractive index between the lowE or other coating on the glass panel and air. In one example, a lowE coating commonly known as Q4™, available from CARDINAL CG, of Tumwater, Wash. The reflection reducing coating included a 5.25 nm thick layer of titanium/praseodymium oxide, a 84.62 nm layer of $MgF_2$, a 86.82 nm layer of titanium/praseodymium oxide, a 25 nm layer of indium-tin oxide, and a 63.36 nm layer of $MgF_2$, which interfaces with the air. The index-matching stack is deposited directly on the lowE coating stack. In another embodiment, the first and third layers are itanium dioxide layers. In other embodiments, other metal oxide layers could be used. The exact materials and thicknesses of the index-matching overcoat varies according to the type of coating being matched (overcoated), and many different combinations of materials and combinations might solve any given index-matching system. The coating might be index-matched to air or the adhesive layer of a pressure-applied polymer film, for example, among other media. Other types of moisture-sensitve coatings would generally be index matched using a different thin-film stack, as is known in the art of AR coatings.

Figure 3:
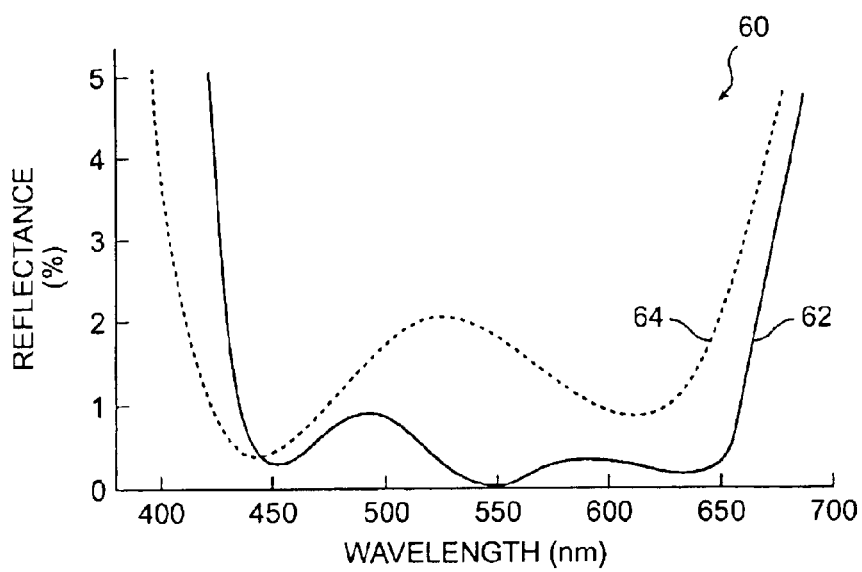
FIG. 3 is a simplified graph of the predicted reflectivity of a conductive coating stack with and without an index-matching coating.

FIG. 3 is a simplified graph 60 of the predicted reflectivity of a Q4™ conductive coating stack with 62 and without 64 the index-matching stack described in the preceding paragraph. This model was conducted with white light in an air medium, with the coatings on a glass substrate and an ideal detector. A 15-degree angle of incidence was assumed.

Experimental data shows that unprotected lowE-type coatings might not consistently pass the 20-rub eraser abrasion test. With an overcoat process that provides an $MgF_2$ layer as the top layer, a glass panel will consistently pass a 40-rub eraser abrasion test. It is believed that the coefficient of friction of the surface of the panel is modified by the $MgF_2$, which is relatively smooth and offers a lower coefficient of friction on the surface.

Figure 4:
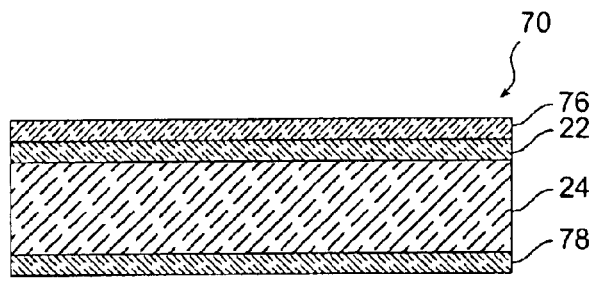
FIG. 4 is a simplified cross section of a glass panel coated according to an embodiment of the present invention.

FIG. 4 is a simplified cross section of a glass panel 70 coated according to an embodiment of the present invention. A glass substrate 22 is coated with a lowE coating 24 and a barrier overcoat 76. The glass substrate can be tempered to improve the breaking strength of the glass and further improve safety by reducing the size of the glass pieces that might result from fracturing the panel. Glass tempering is generally a process that heats the glass and then rapidly cools the glass, which puts the surface of the glass into compression, thus resisting breakage. The tempering process can also create compressive stress in the lowE coating. Tempering can be achieved in a number of different atmospheres and at a number of different temperatures. In some embodiments, it may be desirable to not alter the tempering of the glass, such as when the glass substrate is strongly tempered before coating, yet remove nodules or harden the coating through a heat treatment. For example, a long thermal soak in oxygen at a temperature below the softening point of glass might retain the tempered characteristic of the substrate while facilitating removal of the nodules. In some embodiments, it is generally desirable to provide a heat treatment that produces compressive stress in the coating. It is not required that the coating become compressed, as it is believed that a compressive change in the stress characteristic of the coating may facilitate the removal of nodules.

The lowE coating has been processed to remove nodules, which allows the barrier overcoat to seal the pinholes from moisture. In a particular embodiment the barrier overcoat is a stack of thin-film layers. In a further embodiment, the upper most layer of the overcoat is a low-friction layer. The barrier overcoat stack can also index-match the lowE coating to the environment (typically air). An optional anti-reflective ("AR") coating 78 on the opposite side of the glass substrate may be desirable in applications, such as plasma display screens, where high total transmission of a broad spectrum of light through the glass panel is desirable. The AR coating is designed to index match the glass substrate to the ambient, which is typically air or other gas(es) inside the plasma display. In other words, the barrier overcoat faces the ambient environment, which in one embodiment is a plasma display and in another embodiment is an organic light-emitting diode ("OLED") display. Alternatively, the index-matching coating may interface with the ambient air in a room, or an adhesive layer of a pressure-applied polymer sheet or other medium.

Figure 5:
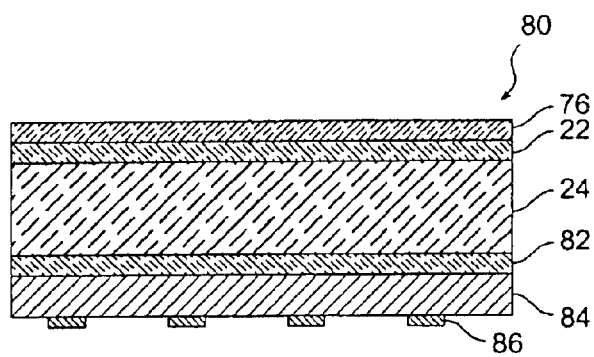
FIG. 5 is a simplified cross section of a coated glass panel with an organic light-emitting diode according to another embodiment of the present invention.

FIG. 5 is a simplified cross section of a portion of an OLED display 80 according to another embodiment of the present invention. A glass substrate 24 has been coated on one side with a lowE coating 22 and a barrier overcoat 76. The other side of the glass panel includes a layer of transparent conductor 82, such as indium-tin oxide ("ITO"), an OLED structure 84, and a conductor layer 86, such as a patterned aluminum layer. The OLED structure typically contains several layers, and is simplified here for purposes of illustration. Other layers of various materials are typically present as well, and are omitted here for clarity of illustration.

The OLED structure is turned on by applying an electric signal between the conductive layers, and emits light through the glass panel and out the lowE coating and barrier overcoat. The lowE coating suppresses EMI from the OLED display, and is typically grounded through a perimeter contact bar, as with the plasma display panel described above in relation to FIG. 2A. In an alternative embodiment, a glass panel with a lowE and barrier overcoat may be used with an OLED display fabricated on a second substrate.

Figure 6:
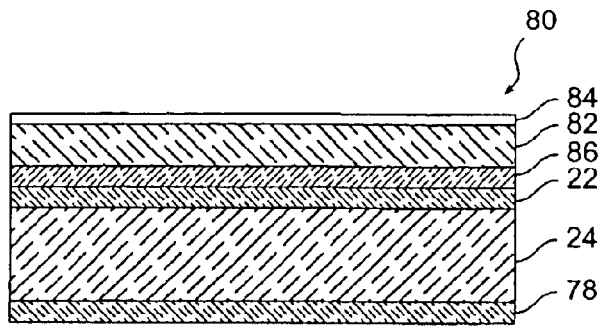
FIG. 6 is a simplified cross section of a glass panel coated according to yet another embodiment of the present invention.

FIG. 6 is a simplified cross section of a glass panel assembly 80 coated according to another embodiment of the present invention. A glass substrate 24, which can be untempered, tempered, or semi-tempered, has an AR coating 78 on one side and a lowE coating 22 on the other. In a preferred embodiment, the lowE coating is processed to remove nodules. In one process, the glass substrate with the lowE coating is tempered. In a further process, the co-tempered glass substrate and lowE coating is washed to further remove nodules. In other processes, the glass substrate is tempered before the lowE or other coating is applied. In yet other embodiments, neither the glass substrate or the coating is tempered, and other techniques are used to remove nodules.

A film of PET 82 with a layer of pressure-sensitive adhesive 86 and another AR coating 84 is applied to the lowE coating 22. The PET film provides protection against breakage, and secures at least some of the glass shards in the event an untempered glass substrate breaks. It is believed that the combination of the AR coating directly on the backside of the glass substrate and the PET film attached to the frontside of the assembly provides sufficient resistance against breakage and safety for some applications. The terms "frontside" and "backside" are only used for convenient discussion and are not limiting for purposes of the glass panel. Applying the AR coating directly to the backside avoids a second application of AR-coated PET film, which could otherwise add considerable cost to the assembly, to achieve a high total transmission of light through the panel.

In a further embodiment, the pressure-sensitive adhesive layer 86 is dyed to provide color-shifting or correction through the glass panel assembly 80. For example, the pressure-sensitive adhesive could be dyed to establish-color balance of a plasma display or tinted to correct or shift the output of an OLED. Alternatively, the PET film could be tinted.

In a particular embodiment, the glass substrate 24 is tempered or semi-tempered. The combination of such a glass substrate with a single layer of PET film 82 attached to the glass is particularly desirable for safety reasons. If the tempered glass panel should break, it typically breaks into relatively small dice, rather than shards. It is believed that the PET film will contain the dice in a safe manner more readily than the shards that might be produced with an untempered glass substrate.

Figure 7:
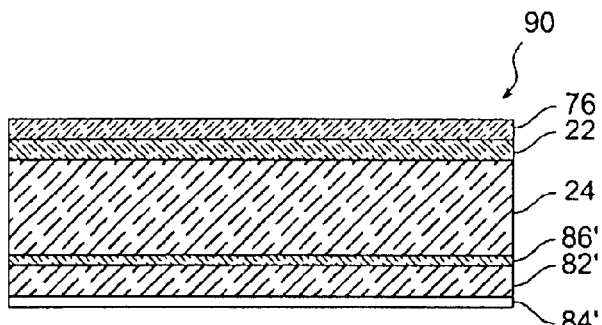
FIG. 7 is a simplified cross section of a glass panel coated according to yet another embodiment of the present invention.

FIG. 7 is a simplified cross section of a glass panel assembly 90 coated according to yet another embodiment of the present invention. A lowE or other coating 22 is formed on one side of the glass substrate 24, which could be untempered, semi-tempered, or tempered. The coating 22 has been processed to remove nodules, which allows a barrier overcoat 76 to seal the pinholes remaining after nodule removal from the environmental moisture. A PET film 82' with a layer of pressure sensitive adhesive 86' has been applied to other side of the glass substrate. An optional AR coating 84' is applied to the PET film, typically before the film is applied to the glass. Other types of adhesives, such as UV-curable adhesive, resin, and thermosetting adhesive may be used to attach other sorts of polymer films, such as polyester films, to glass panels. A dye may be added to the adhesive layer 86' or to the polymer film to color shift or color balance the glass panel.

Figure 8:
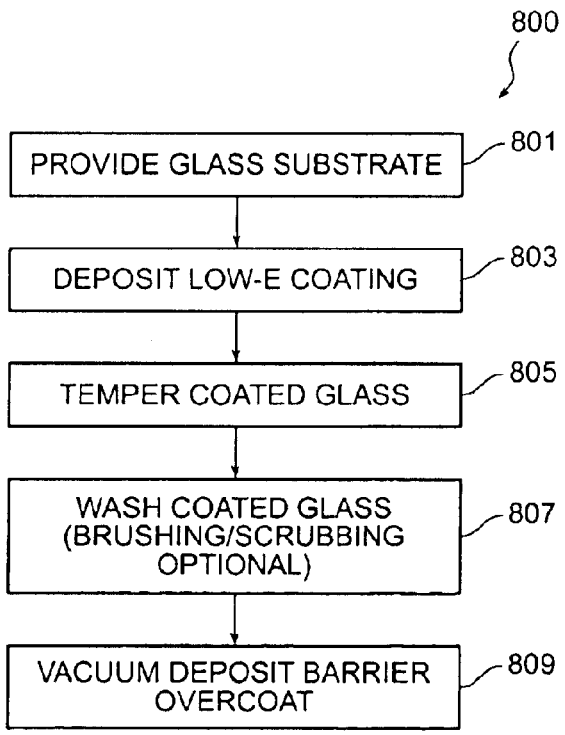
FIG. 8 is a simplified flow chart of a process for fabricating a coated panel according to an embodiment of the present invention.

FIG. 8 is a simplified flow chart of a process 800 for fabricating a coated glass panel according to an embodiment of the present invention. A glass substrate was provided (step 801) and coated with a moisture-sensitive coating, which in one embodiment was a lowE coating (step 803), but other coatings may be used. The lowE coating was a Q4™ that included silver-containing layers that transmit most light while providing shielding of at least some electro-magnetic emissions. Other coatings, including other lowE coatings, could be used.

The Q4™ lowE coating was tempered by heating the glass substrate with the lowE coating in an oxygen-containing atmosphere (e.g. air) to a temperature of 650° C. for about 90 seconds and then cooling in air in about 30 seconds (step 805). This creates compressive stress in the coating and helps to open pinholes by breaking the nodule defects free from the pinholes. The coating also becomes hardened through the tempering process. It is believed that at least some layers in the as-deposited lowE coating are further oxidized during the tempering process. That is, additional oxygen is incorporated into layers of the coating to harden the coating and create the compressive stress. The exact process parameters for tempering vary according to several factors. In one embodiment, the coating is hardened without significantly tempering the glass by heating the coated glass panel to a lower temperature for a period of time sufficient for hardening of the coating, and then slowly cooling the coated glass to avoid thermally fracturing the glass.

The substrate and coating is then cleaned in a mechanical cleaning process (step 807). The cleaning process used high-pressure water and detergent sprays to loosen remaining nodules. The nodules or other artifacts were then swept away with a high-pressure water rinse or a light scrub with soft rotating brushes. The untempered lowE coating was too soft to withstand the mechanical cleaning without tempering, but other coatings may be robust enough to be mechanically cleaned to remove nodules without the tempering step. An $Al_2O_3$ chemical barrier coating on glass, for example, might be durable enough to mechanically remove nodules without tempering. With other coatings, such as front-surface mirrors, nodules might be removed without tempering or washing by applying a pressure-sensitive film with an adhesive that conforms to the surface of the coating, and then removing the film and the nodules that adhere to the adhesive.

Tempering may also be desirable to improve transmission and reduce resistivity of the lowE coating. In one instance, transmission improved from about 68% to about 78% and sheet resistivity decreased from about 4.3 Ohms per square to about 2.3 Ohms per square. The steps of tempering and washing 805, 807 are one embodiment of a step of removing nodules from the moisture-sensitive coating. Other techniques for removal may be used, such as adhesive lift-off, blowing, vacuuming, or washing without tempering, including brushless washing.

The coated substrate was then dried with a warm high-pressure air stream and loaded into a vacuum chamber for application of the barrier overcoat (step 809) before the moisture has time to attack the metal layers of the lowE coating. In this embodiment, it is believed that the vacuum pull-down aided the removal of water from the coating. The barrier overcoat was a thin-film AR stack designed to provide low reflectance across the visible spectrum. Removal of the nodules before depositing the thin-film AR stack allows the AR stack to be deposited directly on the lowE coating. Defects that would otherwise propagate through the thin-film AR stack are avoided by removal of the nodules, thus providing protection of the lowE coating against moisture intrusion and allowing the AR coating to serve as a barrier overcoat. The barrier overcoat does not have to be a thin-film AR stack, and could be other thin films or a thick chemical (polymer) barrier overcoat, for example.

While the invention has been described above with respect to specific embodiments, other embodiments may be apparent to those with ordinary skill in the art. Various details of the described embodiments of the invention may be changed without departing from the spirit or scope of the invention. For example, although embodiments have been described in relation to lowE coatings, which typically include metal-containing layers that are susceptible to moisture intrusion, other coatings, such as chemical barrier coatings may be used according to embodiments of the invention. Therefore, the foregoing description of the embodiments of the invention is provided for the purpose of illustration only, and not for the purpose of limiting the invention as defined by the appended claims and their equivalents.

What is claimed is:

1. A method of fabricating a glass panel, the method comprising:
   providing a glass substrate;
   depositing a moisture-sensitive coating on a first side of the glass substrate;
   removing nodules from the moisture-sensitive coating to form pinholes in the moisture-sensitive coating; and
   sealing the pinholes.

2. The method of claim 1 wherein the moisture-sensitive coating comprises a thin-film stack.

3. The method of claim 2 wherein the thin-film stack is a lowE coating.

4. The method of claim 1 wherein the removing step includes a tempering step and a mechanical cleaning step.

5. The method of claim 4 wherein the mechanical cleaning step includes a high-pressure washing step and a drying step.

6. The method of claim 5 wherein the mechanical cleaning step further includes a brushing step before the drying step.

7. The method of claim 2 wherein the removing step includes a tempering step of heating the glass substrate and the thin-film stack to a temperature of at least 650 degrees Celsius in an oxygen-containing atmosphere.

8. The method of claim 2 further comprising, prior to the removing step, of creating a compressive stress in the thin-film stack.

9. The method of claim 2 further comprising, prior to the removing step, of heating the thin-film stack to a temperature sufficient to add compressive stress in the thin-film stack.

10. The method of claim 1 wherein the sealing step comprises depositing a thin-film stack on the moisture-sensitive coating.

11. The method of claim 10 wherein the second thin-film stack is an index-matching stack.

12. The method of claim 10 wherein the depositing the second thin-film stack includes depositing an $MgF_2$ layer as an uppermost layer of the second thin-film stack.

13. The method of claim 2 wherein the sealing step comprises applying an organic coating on the thin-film stack.

14. The method of claim 13 wherein the organic coating comprises a pressure-sensitive adhesive.

15. The method of claim 13 wherein the organic coating comprises dye to color-shift the output of the glass panel.

16. The method of claim 1 further comprising a step of applying a dyed layer to color shift the output of the glass panel.

17. The method of claim 16 wherein the dyed layer is applied on a second side of the glass substrate.

18. The method of claim of claim 17 wherein the dyed layer is an adhesive layer.

19. The method of claim 17 wherein the dyed layer is a polymer film layer.

20. A method of fabricating a glass panel, the method comprising the ordered steps of:
   providing a glass substrate;
   depositing a lowE coating on a first side of the glass substrate;
   simultaneously tempering the glass substrate and the lowE coating in an oxygen-containing atmosphere;
   mechanically cleaning the lowE coating; and, after cleaning the lowE coating
   depositing an index-matching thin-film stack on the lowE coating.

21. The method of claim 20 further comprising a step of depositing an anti-reflective coating on a second side of the glass substrate.

22. The method of claim 20 wherein the step of mechanically cleaning the lowE coating comprises brushing.

23. The method of claim 20 further comprising a step of applying a dyed layer to color-shift the output of the glass panel.

24. The method of claim 23 wherein the dyed layer is applied on a second side of the glass substrate.

* * * * *